United States Patent [19]

Omura et al.

[11] Patent Number: 4,847,217

[45] Date of Patent: Jul. 11, 1989

[54] METHOD FOR MAKING A SEMICONDUCTOR DEVICE

[75] Inventors: Etsuji Omura; Katsuhiko Goto, both of Itami, Japan

[73] Assignee: Mitsubishi Denki Kabushiki Kaisha, Japan

[21] Appl. No.: 203,763

[22] Filed: Jun. 8, 1988

[30] Foreign Application Priority Data

Aug. 5, 1987 [JP] Japan .................. 62-196820

[51] Int. Cl.$^4$ ................... H01L 21/00; H01L 21/02; H01L 21/22; H01L 21/18

[52] U.S. Cl. ................... 437/160; 437/162; 437/167; 437/168; 437/165

[58] Field of Search ............ 437/160, 162, 167, 168, 437/987

[56] References Cited

U.S. PATENT DOCUMENTS

| | | | |
|---|---|---|---|
| 4,378,255 | 3/1983 | Holonyak, Jr. et al. | 437/167 |
| 4,511,408 | 4/1985 | Holonyak, Jr. | 437/133 |
| 4,594,603 | 6/1986 | Holonyak, Jr. | 357/16 |
| 4,639,275 | 1/1987 | Holonyak, Jr. | 437/126 |
| 4,698,122 | 10/1987 | Wada et al. | 204/192.23 |

FOREIGN PATENT DOCUMENTS

| | | | |
|---|---|---|---|
| 0237081 | 7/1986 | German Democratic Rep. | 437/167 |
| 61-148893 | 7/1986 | Japan . | |
| 87/04006 | 7/1987 | World Int. Prop. O. | 437/168 |

OTHER PUBLICATIONS

Omura, E., Selective Double Diffusion of Zn and Si into GaAs Using Sputtered Si Masks, Extended Abstracts of the 18th (1986 International) Conference on Solid State Devices and Materials, Tokyo, 1986, pp. 141–144.

Greiner, M., Diffusion of Silicon in Gallium Arsenide Using Rapid Thermal Processing: Experiment and Model, Appl. Phys. Lett., 44(8), Apr. 15, 1984.

*Primary Examiner*—Brian E. Hearn
*Assistant Examiner*—B. Everhart
*Attorney, Agent, or Firm*—Leydig, Voit & Mayer

[57] ABSTRACT

A method for producing a semiconductor device includes producing a first mask film on a main surface of a compound semiconductor wafer, patterning the first mask film and producing a second mask film so as to cover at least an end portion of the first mask film, diffusing impurities into the compound semiconductor wafer under gaseous pressure of atoms, which atoms occur in the compound of the semiconductor wafer, thereby to produce a first conductivity type first diffusion region, thermally diffusing impurities into the wafer under gaseous pressure of atoms, which atoms occur in the compound of the semiconductor wafer, thereby to produce a second conductivity type region. Accordingly, the end of the first mask film can be recognized accurately and used as a reference line for pattern alignment in photolithograph. Thus, diffusions of p type and n type impurities can be conducted at a high positional precision, and an outstanding performance semiconductor device can be obtained.

4 Claims, 2 Drawing Sheets

METHOD FOR MAKING A SEMICONDUCTOR DEVICE

FIELD OF THE INVENTION

The present invention relates to a semiconductor device and a method of producing such, and more particularly to those which utilize impurity diffusion of p type and n type impurities.

BACKGROUND OF THE INVENTION

Techniques of impurity diffusion are important as those to be utilized in producing semiconductor devices such as semiconductor lasers or light emission diodes.

FIG. 3 shows a prior art production method of a laser diode utilizing diffusion of p type and n type impurities. In FIG. 3, reference numeral 1 designates a semi-insulative GaAs substrate. A high resistance AlGaAs layer 9 is produced on the semi-insulative GaAs substrate 1. A superlattice active layer 2 comprising GaAs and AlGaAs layers is provided, put between the high resistance AlGaAs layers 9. An n type and a p type diffusion region 5 and 6 are produced by impurity diffusion, respectively. A SiN film 4 is produced on the high resistance AlGaAs layer 9 as a mask for impurity diffusion for producing the n type impurity diffusion region 5. A SiN film 11 is produced on the high resistance AlGaAs layer 9 as a mask for producing the p type diffusion region 6. Reference numeral 7 designates a diffusion front of the n type diffusion region 5. Reference numeral 12 designates a diffusion front of the p type impurity diffusion region 6. Reference numeral 8 designates an active region of the superlattice active layer 2.

The production method of this laser diode will be described.

First of all, on the (100) main surface of a semiconductor wafer having a superlattice layer 2, a SiN film 4 as a diffusion mask is produced to a thickness of 700 to 1000 Angstroms by thermal chemical vapor deposition (CVD) or low pressure CVD. Thereafter, a window of stripe photolithography. For the etching of the SiN film 4, a plasma etching using an etching gas mainly consisting of $CF_4$ gas is used. Selective diffusion of n type impurities is conducted only into the window region of the semiconductor wafer having such a window region by a closed tube method, thereby producing an n type diffusion region 5. In the diffusion, Si is used as diffusion source of n type impurties and metal As is generally used to produce As ambient for preventing thermal decomposition of GaAs wafer, that is, dispersion of As into the ambient due to the thermal processing. The diffusion is conducted at a temperature of about 850 degrees centigrade. In the superlattice layer 2 at the n type diffusion region 5, disordering of crystals occurs, thereby producing mixture of crystalline GaAs and AlGaAs.

Next, the SiN film 4 which has been used as a diffusion mask is removed and a SiN film 11 as a second diffusion mask is grown on the surface of the semiconductor wafer. A window aperturing is again executed to the SiN film 11 by photolithography in a state where the n type diffusion region 5 is covered by the film. Then, it is required that the diffusion front 7 and the end of the SiN film 11 are spaced-apart from each other by several microns. Because the diffusion front 7 cannot be usually seen from the surface of the semiconductor wafer, an extra process such as etching for making the diffusion front 7 easy to be seen is required. This etching is conducted by using mixed solution of hydrofluoric acid, hydrogen peroxide, and water, and the diffusion front can be recognized when step is produced between the n type diffusion region 5 and the high resistance AlGaAs layer 9 due to the difference in the etching rates. Even after the diffusion front 7 is made easy to be seen from the surface of the semiconductor wafer, the diffusion front 7 is rather difficult to be recognizd and it is quite difficult to conduct mask alignment with positioning the end of the SiN film 11 at a position by several microns apart from the diffusion front 7. After this patterning, diffusion of Zn is conducted by such as a closed tube method to produce a p type diffusion region 6. Metal Zn is used as a diffusion source and metal As is used for preventing thermal decomposition of GaAs wafer. The diffusion temperature is made about 700 degrees centigrade. In the superlattice active layer 2 at the p type diffusion region 6, disordering of crystal also occurs.

After the diffusion is concluded, electrodes (not shown) are produced on the n type and p type diffusion regions, respectively. When a bias is applied to the semiconductor laser with making the p type diffusion region 6 biased in a forward direction, a current flows through the p type diffusion region 6, the active region 8, and the n type diffusion region 5. The active region 8 is surrounded by the AlGaAs layers at above and below, and by disordered AlGaAs layers at left and right, and thus a so-called BH (buried heterostructure) laser capable of realizing a low threshold curent and a fundamental tansverse mode oscillation is obtained.

In the prior art production method of a semiconductor device of such a construction, the positional alignment of the second diffusion mask is quite difficult, and this made it quite difficult to obtian high performance device with a high reproducibility.

SUMMARY OF THE INVENTION

An object of the present invention is to provide a method of producing a semiconductor device capable of obtaining a high performance device with a high reproducibility.

Another object of the present invention is to provide a semiconductor device which is produced by such a method.

Other objects and advantages of the present invention will become apparent from the detailed description given hereinafter; it should be understood, however, that the detailed description and sepcific embodiment are given by way of illustration only, since various changes and modifications within the spirit and the scope of the invention will become apparent to those skilled in the art from this detailed description.

According to the present invention, a process of producing a first mask film on a main surface of a compound semiconductor wafer, a process of patterning the first mask film and producing a pattern of a second mask film so as to cover at least a portion of the first mask film, a process of thermally diffusing impurities into the wafer under a pressure of a gas of atoms occur in the compound of the semiconductor wafer, a process of removing at least a portion of the second mask film, and a process of thermally diffusing impurities into the wafer with at least a portion of the first mask film in place, thereby to produce a second conductivity type second diffusion region, are provided. Accordingly, the end of the first mask film which can be recognized quite clearly and it can be used as a reference line for the pattern alignment of the photolithography. Further the second mask film which is produced so as to cover a portion of the first mask film functions to suppress the diffusion of first conductivity type impurities from the first mask film under the second mask film into the compound semiconductor wafer. Thus, the diffusion front does not coincide with the edge of the first mask film and the diffusion front is positioned inside the first mask film.

DETAILED DESCRIPTION OF THE PREFERRED EMBODIMENTS

An embodiment of the present invention will be described in detail with reference to the drawings.

Figure 3:
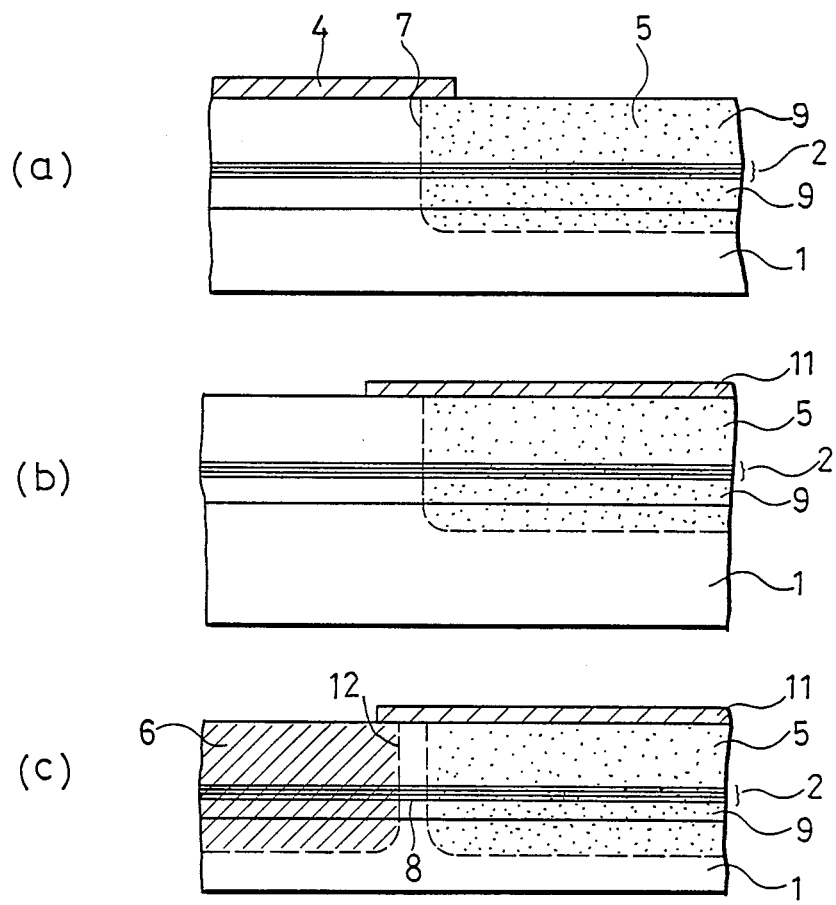
FIGS. 3(a) to (c) are cross-sectional views showing a semiconductor device in each production process of a prior art method of producing a semiconductor device.

FIGS. 1(a) to (d) show cross-sections of a compound semiconductor device in the production processes of a method of producing semiconductor device as an embodiment of the present invention. In FIG. 1, th same reference numerals designate the same or corresponding elements as those shown in FIG. 3.

First of all, on the main surface of a compound semiconductor wafer comprising a semi-insulative GaAs substrate 1 and a high resistance AlGaAs layer 9 including the superlattice layer 2 thereon, a Si film 3 is produced to a thickness of 100 to 1000 Angstroms by a sputtering or an electron beam evaporation. Subsequently thereto, a pattern of stripe configuration of a photoresist is produced by usual photolithography and the Si film 3 is selectively removed by plasma etching using mixed gas of $CF_4$ and $O_2$ in accordance with the resist pattern (FIG. 1(a)).

Subsequently thereto, a SiN film 4 is produced over the entire surface of the main surface of the GaAs wafer having the Si film pattern to a thickness of larger than 500 Angstroms. Next, photolithography and an etching are conducted such that the remain in Sin film 4 overlaps a portion of the Si film 3 of about several microns from the edge of the Si film which constitutes a reference line (FIG. 1(b)). The SiN film 4 produced at a temperture of below about 700 degree centigrade can be easily removed by a hydrofluric acid or a diluted hydrofluoric acid.

On the other hand, because the Si film 3 never is soaked in the hydrofluoric acid, only the SiN film 4 can e selectively etched as shown in FIG. 1(b). The important point here is that the end of the Si film produces a sharp edge because the Si film 10 is produced by a dry etching. Accordingly, the end of the Si film 10 cna be clearly recognized and it can be used as an appropriate reference line for the pattern alignment at the photolithography. This point is greatly improved relative to the prior art method.

Next, the GaAs wafer to which this patterning is executed is thermally processed at, for example, 850 degrees centigrade under pressure of As by a closed tube method. Then, As atoms pass through the Si film 3 where only the Si film 3 exists and reach the boundary between the Si film 3 and the wafer. Because of the As atoms supplied from the outside as such, empty lattice sites of Ga are produced in the GaAs (AlGaAs) wafer, and Si is diffused into the wafer from the Si film 3 through these lattice sites. On the other hand, since As atoms are not diffused into a portion of the Si film 3 covered by the SiN film 4, diffusion of Si does not occur. As a result, the diffusion front 7 remains inside the edge of the Si film 10 s shown in figure 1(c). After the thermal processing, only the SiN film 4 is removed by hydrofluoric acid, and Zn is diffused at about 700 degrees centigrade to produce a p type diffusion region 6. At the processing temperature of about 700 degree centigrade, Si is neither diffused into the wafer form the Si film 3 even under As pressure and does not move from the diffusion region 5. Accordingly, the configuration of the diffusion front 7 of Si diffusion does not change in the Zn diffusion. Such highly precise productions of the n type and p type diffusion regions 5 and 6 result in a high precision and high performance semiconductor device.

Figure 1:
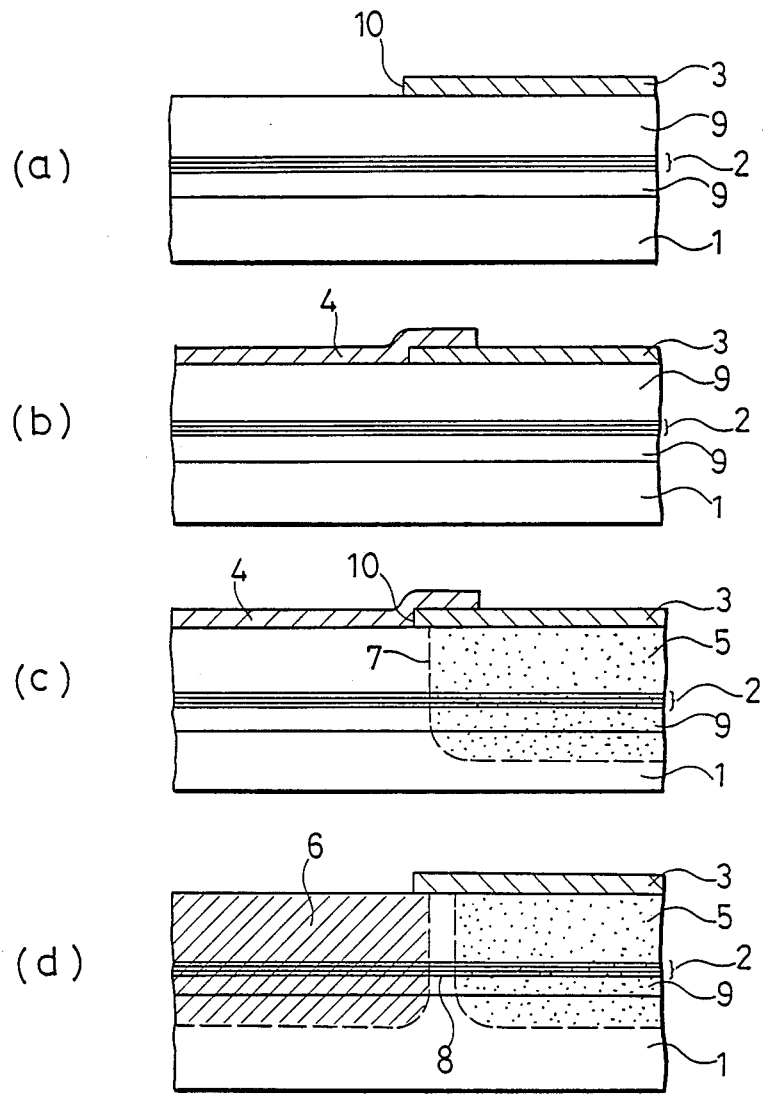
FIGS. 1(a) to (d) are cross-sectional views showing a semiconductor device in each production process of a method of producing a semiconductor device as an embodiment of the present invention.
Figure 2:
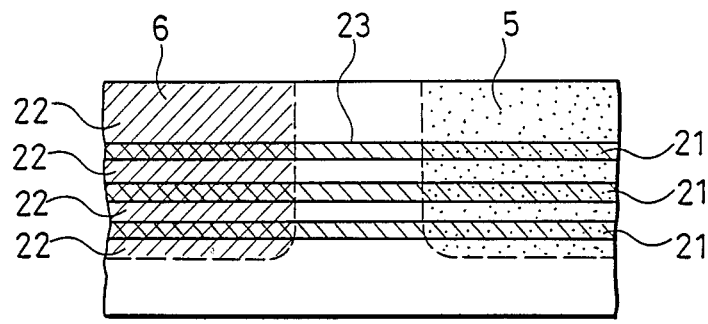
FIG. 2 is cross-sectional view showing an example of a device including pn junctions produced according to the present invention.

FIG. 2 shows a device including pn junctions produced according to the present invention. As shown in FIG. 2, p type and n type impurites are diffused into a wafer in which a plurality of p type GaAs layers 21 and a plurality of n type GaAs layers 22 are grown on a semi-insulative GaAs substrate 1, thereby producing comb type pn junctions 23. This light device functions as a light receiving device when used in a reverse biased state.

In the above illustrated embodiments, mask patterns of stripe configurations are used, but arbitrary shaped mask patterns may be used.

As is evident from the foregoing description, according to the present invention, a process of producing a Si film on a main surface of a semi-insulative GaAs wafer, a process of patterning the Si film and producing a SiN film pattern so as to cover at least a portion of the Si film, a process of thermally diffusion impurities into the compound semiconductor wafer diffusion of n type being conducted under As pressure, a process of removing at least a portion of the SiN film, and a process of thermally diffusing p type impurities while retaining at least a portion of the Si film under As pressure are provided. Therefore, the edge of the Si film can be recognized accurately and it can be used as a reference line for the pattern alignment at the photolithography. Furthermore, the SiN film which is produced so as to cover an end portion of the Si film functions to suppress the diffusion of a type impurities from the Si film under the SiN film into the GaAs wafer. Thus, diffusions of p type and n type impurities can be conducted at a high positional precision, and an outstanding performance semiconductor device can be obtained.

What is claimed is:

1. A method for producing a semiconductor device comprising:
   producing a first mask film on a surface of a compound semiconductor wafer;
   patterning said first mask film and producing a second mask film so as to cover at least an end portion of said first mask film;
   thermally diffusing impurities into said compound semiconductor wafer under gaseous pressure of atoms, which atoms occur in said compound of said semiconductor wafer, thereby to produce a first conductivity type first diffusion region;

removing at least a portion of said second mask film; and thermally diffusing impurities into said wafer with at least a portion of said first mask film in place under gaseous pressure of atoms, which atoms occur in said compound of said semiconductor wafer, thereby to produce a second conductivity type second diffusion region.

2. A method of producing a semiconductor device as defined in claim 1 wherein said compound semiconductor wafer comprises a semi-insulative GaAs substrate and a high resistance AlGaAs layer including a superlattice layer therein, said first mask film comprises a Si film, and said second mask film comprises a SiN film, and said gas pressure is provided by As.

3. A method of producing a semiconductor device as defined in claim 1 wherein said compound semiconductor wafer comprises a semi-insulative GaAs substrate and at least a pair of p type AlGaAs layers and n type AlGaAs layers produced thereon wherein said first mask film comprises a Si film, said second mask film comprises a SiN film, and said gas pressure is provided by As.

4. A method of producing a semiconductor device as defined in claim 1 wherein said compound semiconductor wafer comprises a semi-insulative GaAs substrate and at least a pair of p type GaAs layers and n type GaAs layers produced thereon wherein said first mask film comprises a Si film, said second mask film comprises a SiN film, and said gas pressure is provided by As.

* * * * *